[](#)

United States Patent
Lai et al.

(10) Patent No.: US 8,937,522 B2
(45) Date of Patent: Jan. 20, 2015

(54) TRANSFORMER DEVICE

(71) Applicant: Delta Electronics, Inc., Taoyuan Hsien (TW)

(72) Inventors: Chin-Hsin Lai, Taoyuan Hsien (TW); Chih-Tse Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 13/953,510

(22) Filed: Jul. 29, 2013

(65) Prior Publication Data

US 2014/0292463 A1 Oct. 2, 2014

(30) Foreign Application Priority Data

Mar. 29, 2013 (TW) .............. 102111659 A (51) Int. Cl.
*H01F 27/29* (2006.01)
*H01F 27/24* (2006.01)
*H01F 27/02* (2006.01)

(52) U.S. Cl.
CPC .............. *H01F 27/29* (2013.01); *H01F 27/027* (2013.01)
USPC .......................................... 336/192; 336/212

(58) Field of Classification Search
USPC ............ 336/192, 212, 221, 170, 187–189, 83
See application file for complete search history.

(56) References Cited

U.S. PATENT DOCUMENTS

| | | | |
|---|---|---|---|
| 6,965,289 B2 | 11/2005 | Toi et al. | |
| 7,688,173 B2 | 3/2010 | Azuma et al. | |
| 7,791,444 B2 | 9/2010 | Tomonari et al. | |
| 7,889,045 B2 | 2/2011 | Tomonari et al. | |
| 7,932,803 B2 | 4/2011 | Hirai | |
| 7,993,163 B2 | 8/2011 | Wu et al. | |
| 8,093,980 B2 | 1/2012 | Asou et al. | |
| 8,152,567 B2 | 4/2012 | Wu et al. | |
| 2002/0180574 A1* | 12/2002 | Toi et al. .......................... | 336/83 |
| 2007/0285200 A1 | 12/2007 | Hsieh | |
| 2007/0294880 A1 | 12/2007 | Hsieh | |
| 2008/0309445 A1* | 12/2008 | Suzuki et al. .................. | 336/183 |
| 2009/0278652 A1* | 11/2009 | Shoji et al. ..................... | 336/221 |
| 2010/0109827 A1* | 5/2010 | Asou et al. ..................... | 336/192 |
| 2011/0122589 A1 | 5/2011 | Wu et al. | |
| 2012/0112867 A1 | 5/2012 | Chow et al. | |
| 2012/0113602 A1 | 5/2012 | Zhang et al. | |
| 2012/0133469 A1 | 5/2012 | Tomonari et al. | |
| 2013/0049914 A1* | 2/2013 | Huang et al. .................. | 336/192 |
| 2014/0179163 A1 | 6/2014 | Zhang | |

FOREIGN PATENT DOCUMENTS

| | | | |
|---|---|---|---|
| JP | 2007294810 A1 | 11/2007 | |
| JP | 2009206352 A1 | 9/2009 | |
| JP | 2010109267 A1 | 5/2010 | |

\* cited by examiner

*Primary Examiner* — Mangtin Lian
(74) *Attorney, Agent, or Firm* — Muncy, Geissler, Olds & Lowe, P.C.

(57) ABSTRACT

A transformer device is disclosed in which a transformer module includes a first transformer unit disposed on a PCB and having a plurality of first pins and a plurality of second pins, and a second transformer unit disposed on the PCB and adjacent to the first transformer unit. The second transformer has a plurality of third pins and a plurality of fourth pins. First to fourth conductive lines are disposed on the PCB, and configured to electrically connect to the plurality of first to fourth pins, respectively. The plurality of first and third pins are located on a first side of the transformer module, the plurality of second and fourth pins are located on a second side opposite to the first side, and the plurality of first pins are adjacent to the plurality of third pins.

9 Claims, 8 Drawing Sheets

TRANSFORMER DEVICE

CROSS REFERENCE TO RELATED APPLICATION

This Application claims priority of Taiwan Patent Application No. 102111659 filed on Mar. 29, 2013, the entirety of which is incorporated by reference herein.

BACKGROUND OF THE INVENTION

1. Field of the Invention

The present invention relates to a transformer device and in particular, relates to a transformer device having center taps which can be determined freely.

2. Description of the Related Art

As a result of the fixed center tap of the conventional transformer, the primary and secondary coils are usually arranged at fixed side for the adjacent conventional transformers. Two adjacent transformers are usually adjacent to different sides (i.e. the primary coil of the first transformer is adjacent to the secondary coil of the second transformer), and the spacing between the two transformers is usually increased to avoid a high voltage discharge path from being generated by the primary and secondary coils of the different transformers, when a plurality transformers are disposed on a printed circuit board side by side. However, when the spacing between two transformers is increased, more area of the printed circuit board is needed and costs of the printed circuit board are increased. Thus, a transformer utilizing less layout area is needed.

BRIEF SUMMARY OF INVENTION

A detailed description is given in the following embodiments with reference to the accompanying drawings.

An embodiment of a transformer device is disclosed. A transformer device includes a PCB, a transformer module and first to fourth conductive lines. The transformer module includes a first transformer unit disposed on the PCB and having a plurality of first pins and a plurality of second pins, and a second transformer unit disposed on the PCB and adjacent to the first transformer unit. The second transformer has a plurality of third pins and a plurality of fourth pins. The first to fourth conductive lines are disposed on the PCB, and configured to electrically connect to the plurality of first to fourth pins, respectively. The plurality of first and third pins are located on a first side of the transformer module, the plurality of second and fourth pins are located on a second side opposite to the first side, and the plurality of first pins are adjacent to the plurality of third pins.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
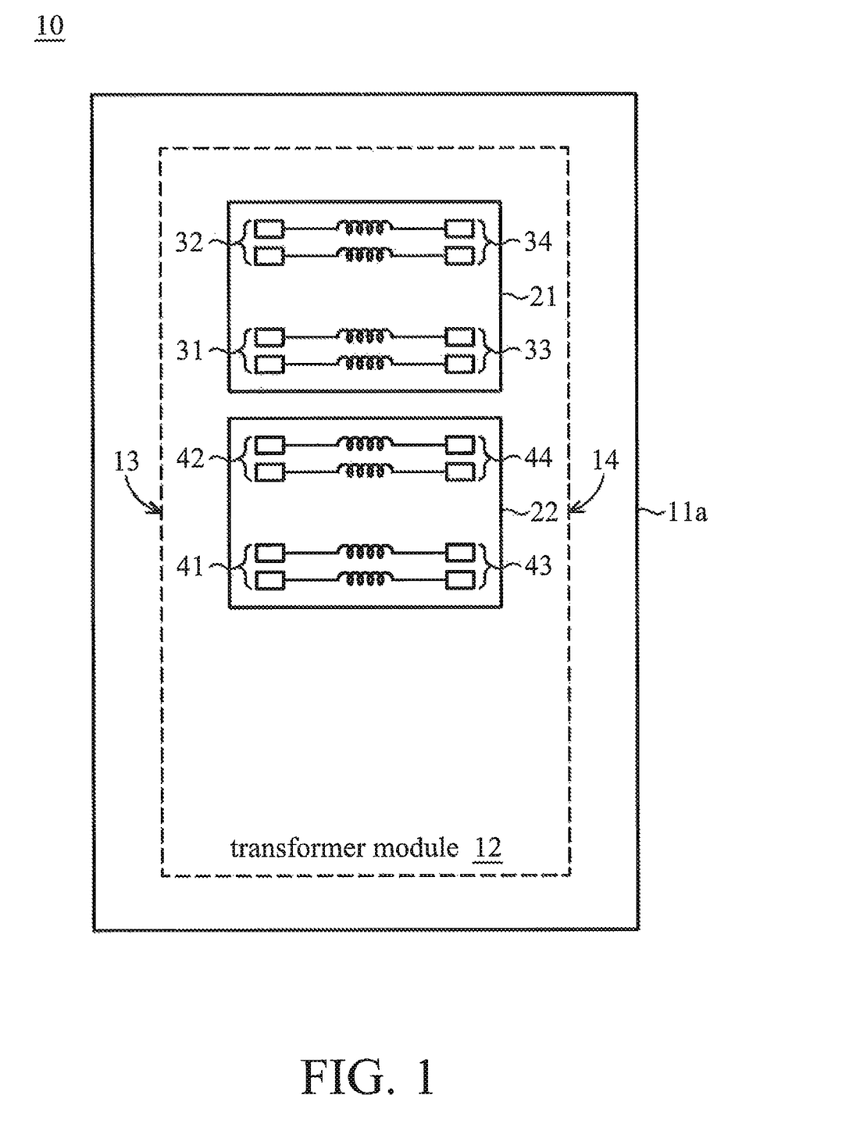
FIG. 1 is a schematic diagram showing an embodiment of a transformer device of the invention.
Figure 2:
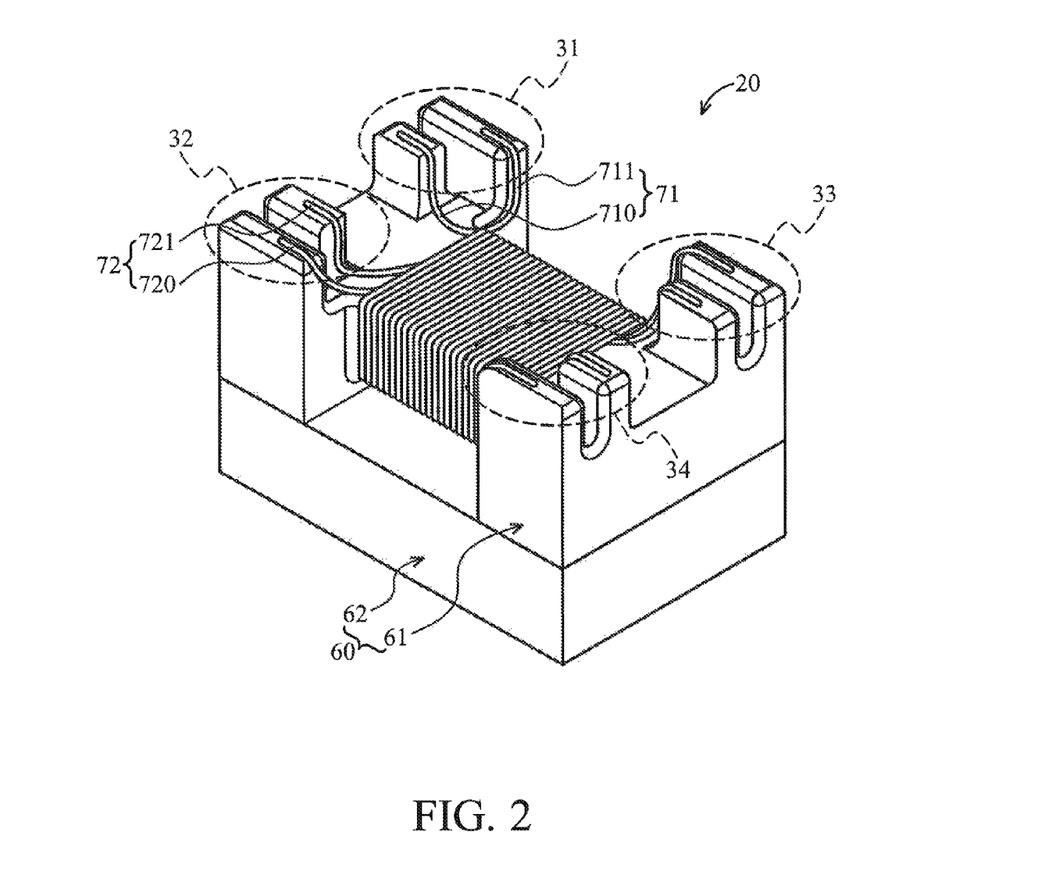
FIG. 2 is another schematic diagram showing the embodiment of a transformer unit of the invention.

FIG. 1 is a schematic diagram of a transformer device according to an embodiment of this disclosure. As shown in FIG. 1, the transformer device 10 includes a printed circuit board (PCB) 11a and a transformer module 12. The transformer module 12 is disposed on the PCB 11a, and includes a first transformer unit 21 and a second transformer unit 22. The first and the second transformer units 21 and 22 are disposed on the PCB 11a and arranged adjacent to each other (i.e., side by side). As shown in FIG. 1, the pin sets 31, 32, 33 and 34 can be regarded as the pins of the first transformer unit 21 and the pin sets 41, 42, 43 and 44 can be regarded as the pins of the second transformer unit 22. FIG. 2 is a structure diagram of the first and the second transformer units 21 and 22 of FIG. 1. As shown in FIG. 2, the transformer unit 20 has a magnetic core element 60, a first routing wire set 71 and a second routing wire set 72. The magnetic core element 60 includes a first magnetic core 61 and a second magnetic core 62. For example, the first magnetic core 61 can be a drum core, and the second can be a slab core, but they are not limited thereto. Specifically, the first magnetic core 61 has the pin sets 31, 32, 33 and 34. The pin sets 31 and 32 are located on the same side of the first magnetic core 61, and the pin sets 33 and 34 are located on the other side opposite to the pine sets 31 and 32. In this embodiment, each of the pin sets has 2 pins, but they are not limited thereto. In some embodiments, each of the pin sets can have more than 2 pins.

Regarding to FIG. 2, the first and second routing wire sets 71 and 72 are wound on the first magnetic core 61. The first routing wire set 71 is electrically connected to the pin sets 31 and 33 and the second routing wire set 72 is electrically connected to the pin sets 32 and 34, wherein the first and second routing wire sets 71 and 72 and the magnetic core element 60 can be arranged to generate electromagnetic coupling effect. Specifically, in this embodiment, the first routing wire set 71 has wires 710 and 711, the wire 710 is electrically connected to one of the pins of the pin set 31 and one of the pins of pin set 33, and the wire 710 is electrically connected to one of the pins of the pin set 31 and one of the pins of pin set 33. Similarly, the second routing wire set 72 has wires 720 and 721, wherein the electrical connection method of the wires 720 and 721 and pin sets 32 and 34 is the same as that of the wires 710 and 711 and pin sets 31 and 33, and thus, details thereof are omitted for brevity. In an embodiment, the first routing wire set 71 and the second routing wire set 72 are wound on the first magnetic core 61 in opposite directions. For example, the first routing wire set 71 is wound on the first magnetic core 61 in the clockwise direction, and the second routing wire set 72 is wound on the first magnetic core 61 in the counterclockwise direction.

Referring to FIG. 1 again, the pin sets 31 and 33 of the first transformer unit 21 of the transformer device 10 are symmetrically disposed on the PCB 11a and the pin sets 32 and 34 are also symmetrically disposed on the PCB 11a. The pin sets 41 and 43 of the second transformer unit 22 are symmetrically disposed on the PCB 11a and the pin sets 42 and 44 are also symmetrically disposed on the PCB 11a. More specifically, the pin sets 31, 32, 41, and 42 are located on the first side 13 of the transformer module 12, and the pin sets 33, 34, 43, and 44 are located on the second side 14 of the transformer module 12. Furthermore, the pin sets 31 and 33 of the first transformer unit 21 are adjacent to the pin sets 42 and 44 of the second transformer unit 22.

Figure 3A:
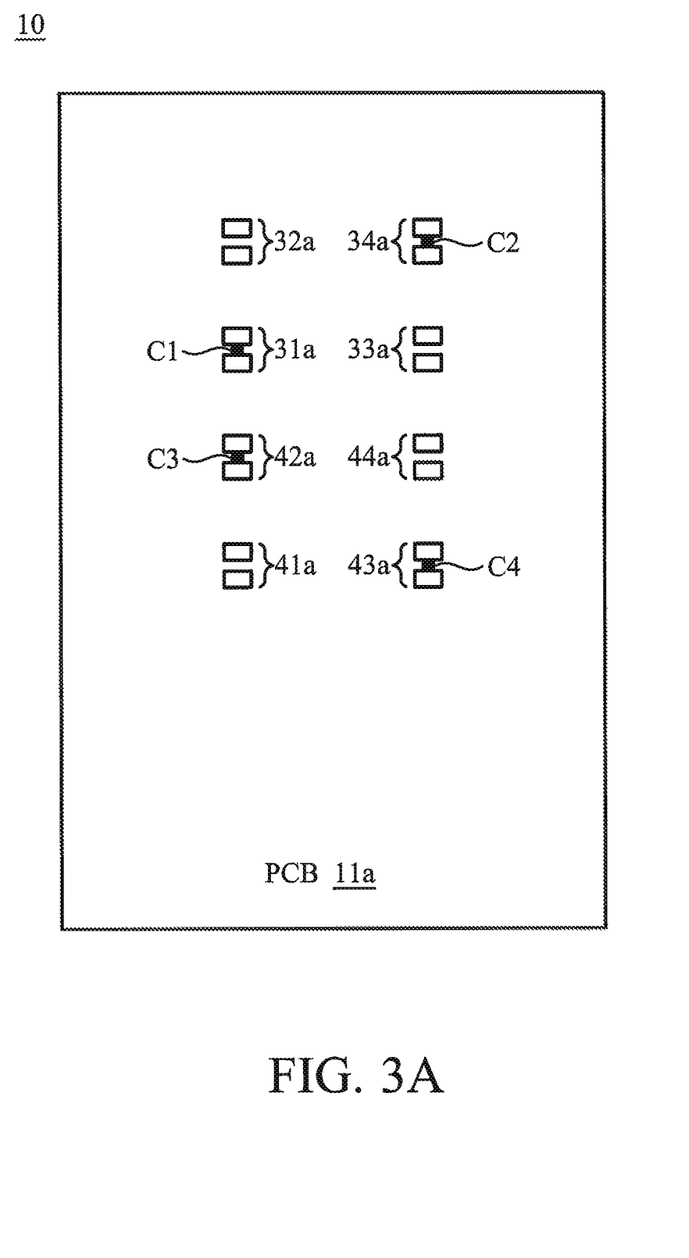
FIG. 3A is another schematic diagram showing a connection method of a printed circuit board of the invention.

Please refer to FIG. 3A, FIG. 3A is the schematic of the connection method of the PCB 11a of FIG. 1. As shown in FIG. 3A, the PCB 11a has a plurality of solder pads corresponding to the pins of the first transformer unit 21 and the second transformer unit 22. It should be noted that the sets of the solder pads located on the PCB 11a are corresponding to the pin sets of the transformers. For example, the sets 31a, 32a, 33a, and 34a of the solder pads are configured to electrically connect to the pin sets 31, 32, 33, and 34 of the first transformer unit 21, respectively. As shown in FIG. 3A, a first conductive line C1 is disposed on the PCB 11a, and the first conductive line C1 is configured to connect to the two solder pads of the set 31a of solder pads, such that the first conductive line C1 electrically connects to the two pins (i.e., the plurality of first pins) of the pin set 31 of the first transformer unit 21 to form the center tap of the first transformer unit 21 when the first transformer unit 21 is disposed on the PCB 11a. In addition, the second conductive line C2 connects to the two solder pads of the set 34a of the solder pads such that the second conductive line C2 electrically connects to the two pins (i.e., the plurality of second pins) of the pin set 34 of the first transformer unit 21 to form the center tap of the first transformer unit 21 when the first transformer unit 21 is disposed on the PCB 11a. Similarly, a third conductive line C3 is disposed on the PCB 11a, and the third conductive line C3 connects to the two pins (i.e., the plurality of third pins) of the pin set 42 of the second transformer unit to form the center tap of the second transformer unit 22 when the second transformer unit 22 is disposed on the PCB 11a. The fourth conductive line C4 electrically connects to the two pins (i.e., the plurality of fourth pins) of the pin set 43 of the second transformer unit 22 to form the center tap of the second transformer unit 22.

As shown in FIG. 1 and FIG. 3A, the first transformer unit 21 are adjacent to the second transformer unit 22, and thus, the center tap of the first transformer unit 21 and the center tap of the second transformer unit 22 (includes the pin sets 31 and 42 and the first and third conductive lines C1 and C3) are located on the same side (i.e., the first side 13) of the transformer module 12. For example, in this embodiment, the center tap of the primary coil of the first transformer unit 21 is formed by the pin set 34 and the second conductive line C2, and the center tap of the secondary coil of the first transformer unit 21 is formed by the pin set 31 and the first conductive line C1. The pin set 33 can serve as the pins of the secondary coil of the first transformer unit 21, and the pin set 32 can serve as the pins of the primary coil of the first transformer unit 21. Similarly, the center tap of the secondary coil of the second transformer unit 22 is formed by the pin set 42 and the third conductive line C3, and the center tap of the primary coil of the second transformer unit 22 is formed by the pin set 43 and the fourth conductive line C4. The pin set 44 can serve as the pins of the secondary coil of the second transformer unit 22, and the pin set 41 can serve as the pins of the primary coil of the second transformer unit 22.

Figure 3B:
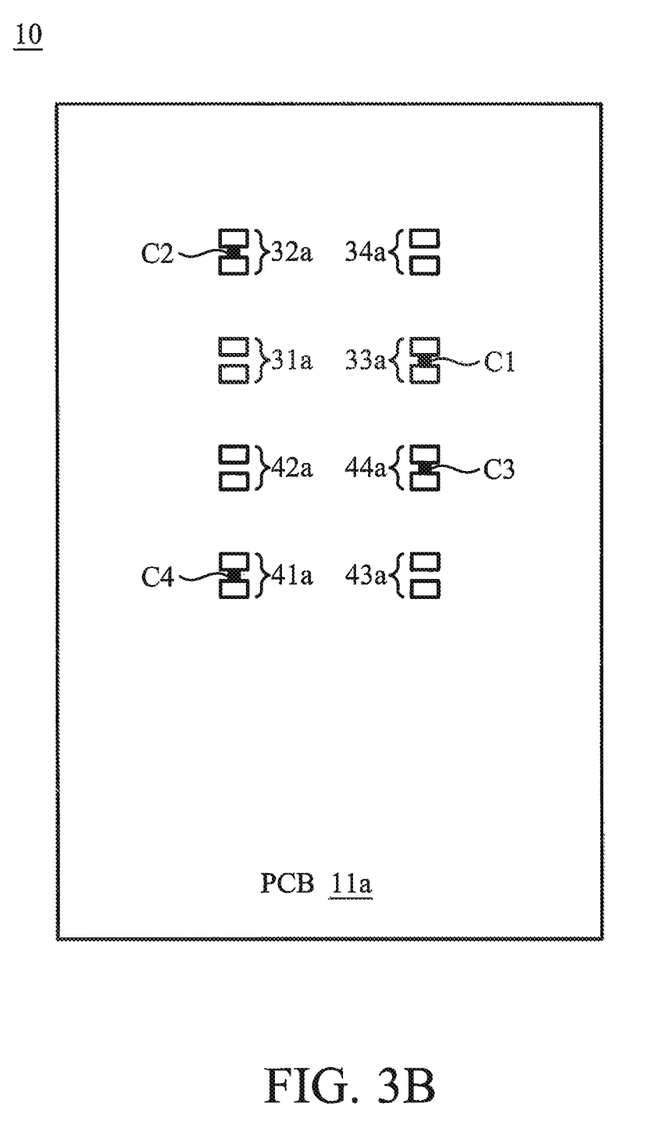
FIG. 3B is another schematic diagram showing a connection method of a printed circuit board of the invention.

In this embodiment, the pin sets 32 and 33 of the first transformer unit 21 can serve as the pins of the primary coil and the pins of the secondary coil, respectively, and the pin sets 34 and 31 can serve as the center taps of the primary coil and secondary coil, respectively, but the primary coil and the secondary coil of the first transformer unit 21 can be interchanged based on practical application requirements, and they are not limited thereto. For example, in another embodiment (as shown in FIG. 3B), the center tap of the primary coil of the first transformer unit 21 is formed by the pin set 33 and the first conductive line C1, and the central tap of secondary coil of the first transformer unit 21 is formed by the pin set 32 and the second conductive line C2. The pin set 31 can serve as the pins of the primary coil of the first transformer unit 21, and the pin set 34 can serve as the pins of the secondary coil of the secondary transformer unit 21. Similarly, the center tap of the primary coil of the second transformer unit 22 is formed by the pin set 44 and the third conductive line C3, and the center tap of the secondary coil of the second transformer unit 22 is formed by the pin set 41 and the fourth conductive line C4. The pin set 42 can serve as the pins of the primary coil of the second transformer unit 22, and the pin set 43 can serve as the pins of the secondary coil of the second transformer unit 22.

Figure 4:
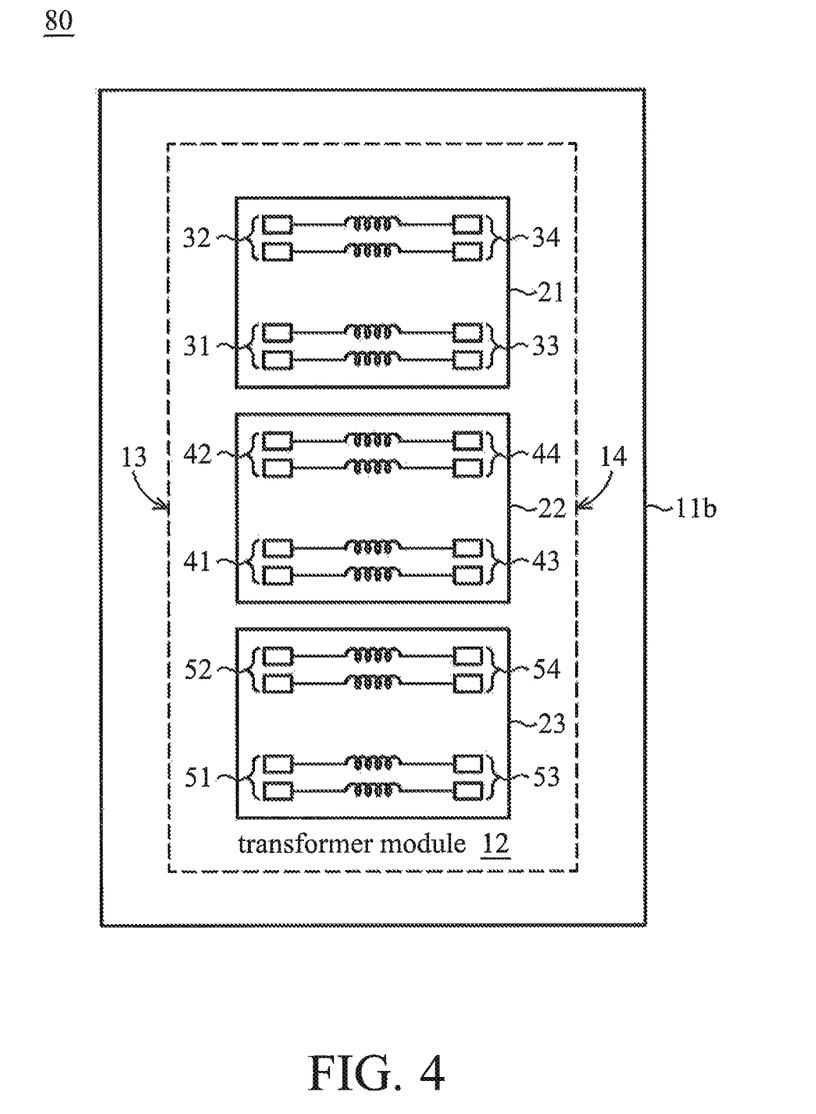
FIG. 4 is another schematic diagram showing an embodiment of a transformer device of the invention.

FIG. 4 is a schematic diagram of the transformer device according to an embodiment of this disclosure. As shown in FIG. 4, transformer device 80 is similar to the transformer device 10 shown in FIG. 1 and the difference is that the transformer device 80 further comprises a third transformer unit 23 and the third transformer unit 23 is adjacent to the secondary transformer unit 22. The structure of the third transformer unit 23 is similar to the structure of the secondary transformer unit 20 shown in FIG. 2. In this embodiment, the third transformer unit 23 has the pin sets 51 and 52 located on the first side 13 of the transformer module 12, and the pin sets 53 and 54 located on the second side 14 of the transformer module 12.

Figure 5:
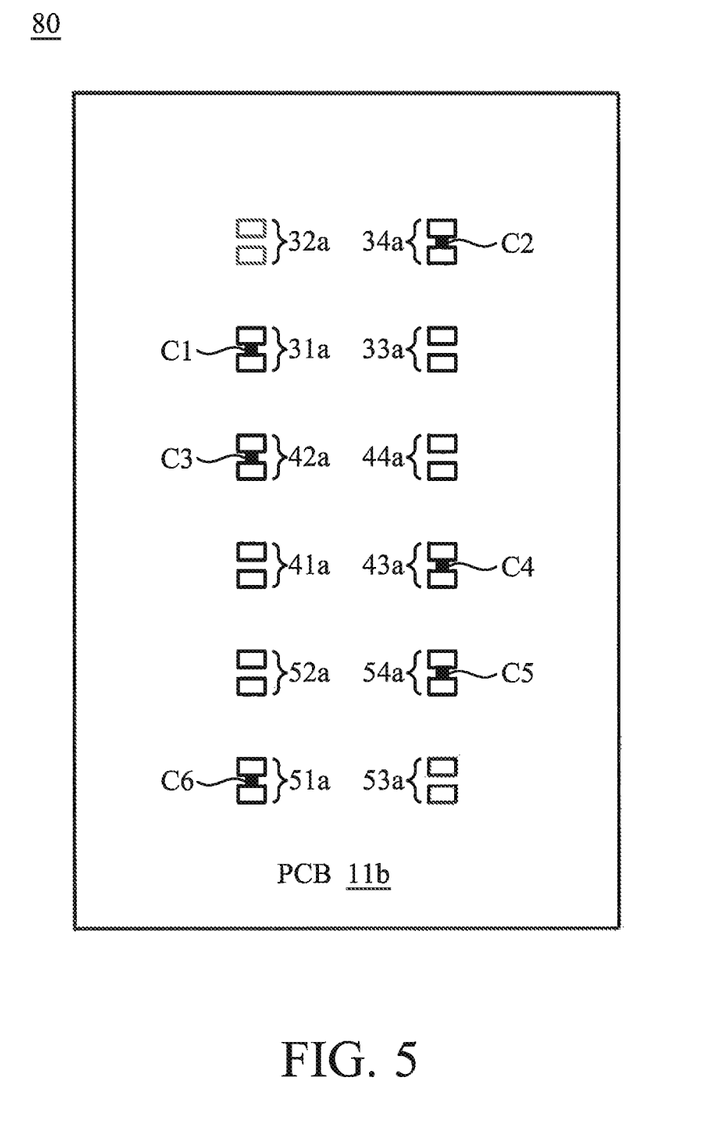
FIG. 5 is another schematic diagram showing a connection method of a printed circuit board of the invention.

Please refer to FIG. 5, FIG. 5 is a schematic diagram of the PCB 11b of FIG. 4. As shown in FIG. 5, the PCB 11b of FIG. 5 is similar to the PCB 11a of FIG. 3a and the difference is that the PCB 11a further comprises the sets 51a, 52a, 53a and 54a of the solder pads which corresponded to the pin sets of the third transformer unit 23. As shown in FIG. 4 and FIG. 5, the pin sets 41 and 43 of the second transformer unit 22 are respectively adjacent to the pin sets 52 and 54 of the third transformer unit 23, the fourth conductive line C4 is connected to the pin set 43 (i.e., the plurality of fourth pins) to form the central tap, the fifth conductive C5 is connected to the pin set 54 (i.e., the fifth pins) to form the central tap, and the sixth conductive line C6 is connected to the pin set 51 (i.e., the sixth pins) to form the central tap. In this embodiment, the two adjacent center taps of the second transformer unit 22 and the third transformer unit 23 are all located on the second side 14 of the transformer module 12.

Figure 6:
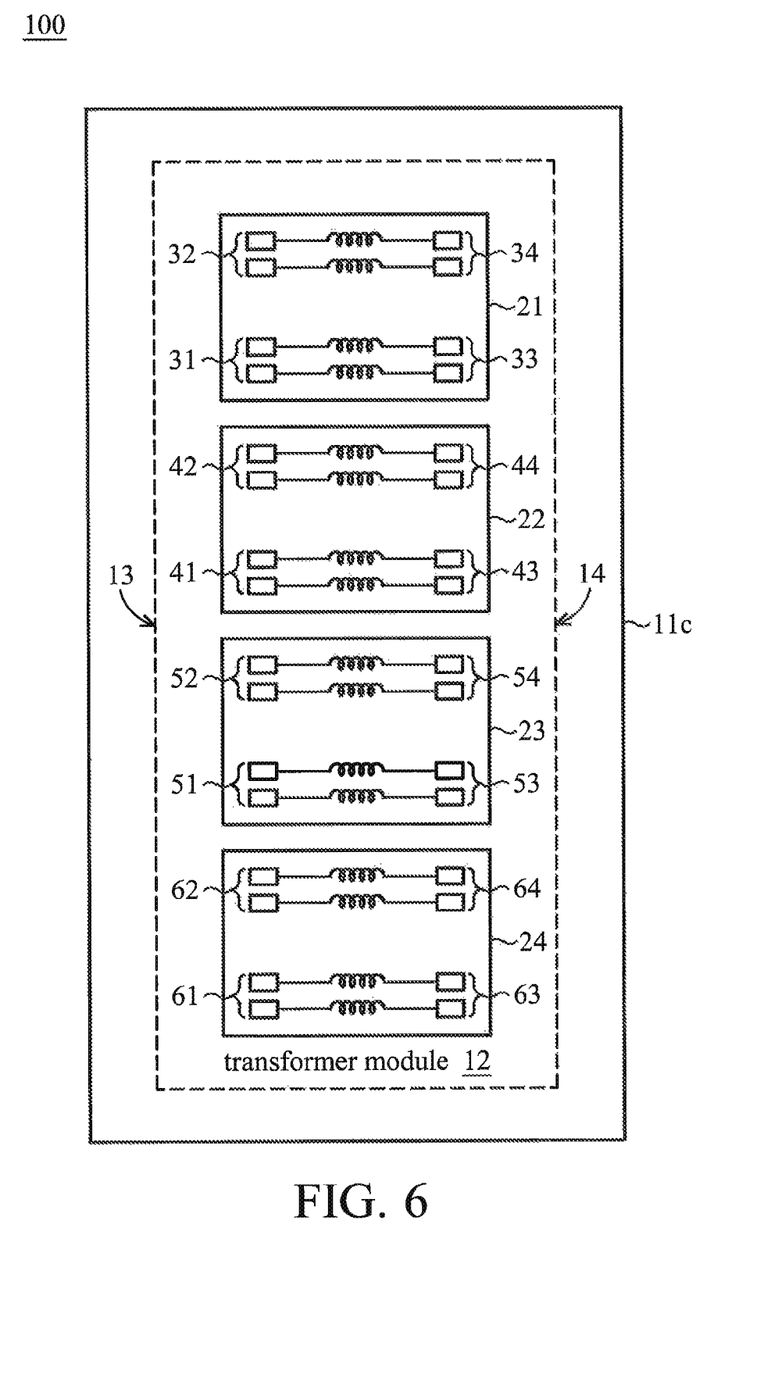
FIG. 6 is another schematic diagram showing an embodiment of a transformer device of the invention.

FIG. 6 is another schematic diagram of the transformer device according to an embodiment of this disclosure. As shown in FIG. 6, the transformer device 100 is similar to the transformer device 80 shown in FIG. 4, and the difference is that the transformer module 12 of the transformer device 100 further comprises a fourth transformer unit 24 and the fourth transformer unit 24 is adjacent to the third transformer unit 23. The structure of the fourth transformer unit 24 is similar to the structure of the transformer unit 20 shown in FIG. 2. In this embodiment, the fourth transformer unit 24 has the pin sets 61 and 62 located on the first side 13 of the transformer module 12, and the pin sets 63 and 64 located on the second side 14 of the transformer module 12.

Figure 7:
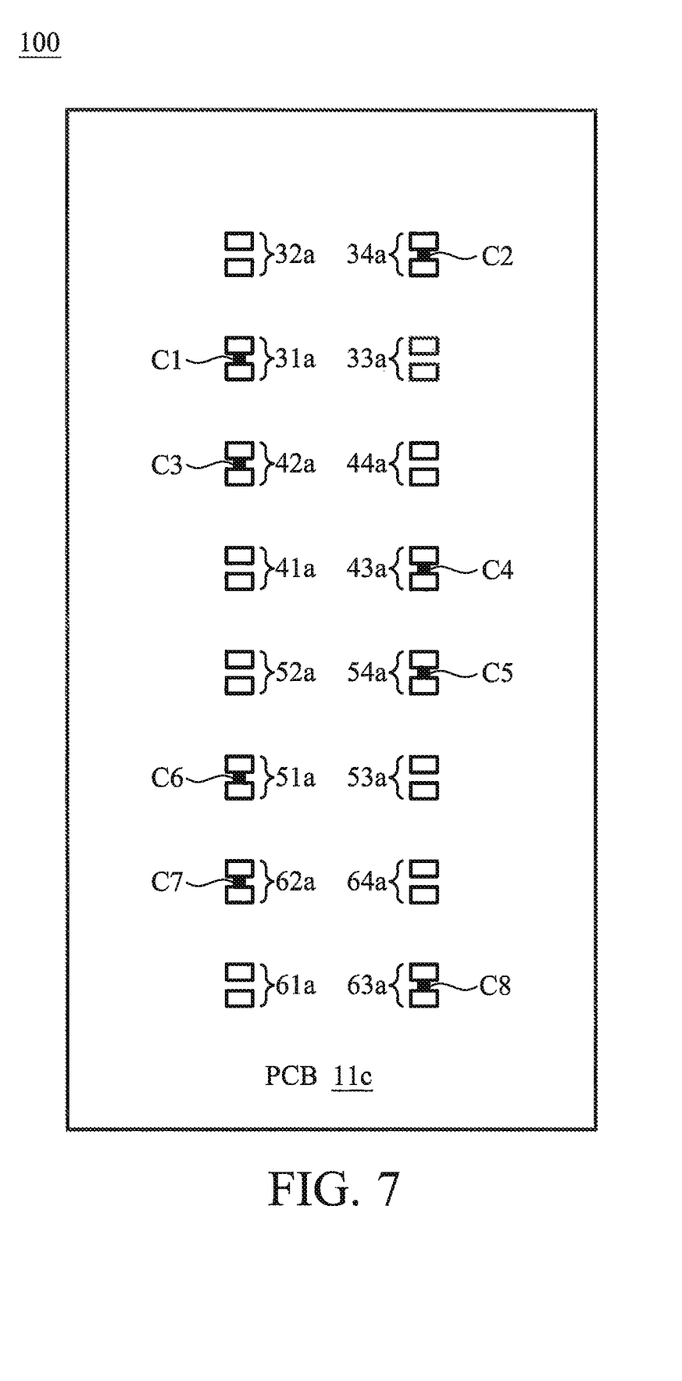
FIG. 7 is another schematic diagram showing a connection method of a printed circuit board of the invention.

Please refer to FIG. 7, FIG. 7 is a schematic diagram of the connection method of PCB 11c shown in FIG. 6. As shown in FIG. 7, the PCB 11c of FIG. 7 is similar to the PCB 11b shown in FIG. 5, and the difference is that the PCB 11c further comprises the sets 61a, 62a, 63a and 64a of the solder pads corresponding to the pin sets of the fourth transformer unit 24. As shown in FIG. 6 and FIG. 7, the pin sets 51 and 53 of the third transformer unit 23 are respectively adjacent to the pin sets 62 and 64 of the fourth transformer unit 24, the sixth conductive line C6 is connected to the pin set 51 (i.e., the sixth pins) to form the central tap, the seventh conductive line C7 is connected to the pin set 62 (i.e., the seventh pins) to form the central tap, and the eighth conductive line C8 is connected to the pin set 63 (i.e., the eighth pins) to form the central tap. In this embodiment, the two adjacent center taps of the third transformer unit 23 and the fourth transformer unit 24 are all located on the second side 13 of the transformer module 12.

As shown in FIG. 6 and FIG. 7, when the plurality of transformer units 21, 22, 23 and 24 are disposed in parallel (i.e., side by side), the location of the center taps can be decided by the conductive lines on the PCB such that the two adjacent transformer units have the same pins of the primary coil (or secondary coil). Thus, the high voltage discharge path between the primary coil and the secondary coil of different transformers can be prevented. Therefore, the two adjacent transformer units in the transformer device of this disclosure have the same pins of primary coil (or secondary coil) and the transformer device has a higher high-voltage insulation ability than conventional methods. Therefore, the transformer device of this disclosure can pass a high-voltage insulation test with spacing that is less than the spacing in conventional transformers. Also, the layout area for the transformers can be effectively decreased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transformer device, comprising:
    a printed circuit board;
    a transformer module, comprising:
        a first transformer unit, disposed on the printed circuit board, and having a first pin set and a second pin set; and
        a second transformer unit, disposed on the printed circuit board and, adjacent to the first transformer unit, and having a third pin set and a fourth pin set;
    a first conductive line, disposed on the printed circuit board, and configured to electrically connect to a first pin and a second pin of the first pin set;
    a second conductive line, disposed on the printed circuit board, and configured to electrically connect to a first pin and a second pin of the second pin set;
    a third conductive line, disposed on the printed circuit board, and configured to electrically connect to a first pin and a second pin of the third pin set; and
    a fourth conductive line, disposed on the printed circuit board, and configured to electrically connect to a first pin and a second pin of the fourth pin set,
    wherein the first and third pin sets are located on a first side of the transformer module, the second and fourth pin sets are located on a second side opposite to the first side, and the first pin set is adjacent to the third pin set.

2. The transformer device as claimed in claim 1, wherein the first transformer unit further comprises a first magnetic core, and the the first and second pin sets are disposed on the first magnetic core.

3. The transformer device as claimed in claim 2, wherein the second transformer unit further comprises a second magnetic core, and the the third and fourth pin sets are disposed on the second magnetic core.

4. The transformer device as claimed in claim 3, wherein the first transformer unit further comprises first and second routing wire sets wound on the first magnetic core, respectively.

5. The transformer device as claimed in claim 4, wherein the second transformer unit further comprises third and fourth routing wire sets wound on the second magnetic core, respectively.

6. The transformer device as claimed in claim 4, wherein the first and second routing wire sets are wound in different directions.

7. The transformer device as claimed in claim 5, wherein the third and fourth routing wire sets are wound in different directions.

8. The transformer device as claimed in claim 1, wherein pin amounts of each of the first, second, third and fourth in sets are 2 or more than 2.

9. The transformer device as claimed in claim 1, wherein the first and second conductive lines are configured to form center taps of the first transformer unit and the third and fourth conductive lines are configured to form center taps of the second transformer unit.

* * * * *